United States Patent [19]
Imaichi et al.

[11] Patent Number: 5,447,779
[45] Date of Patent: * Sep. 5, 1995

[54] RESONANT TAG AND METHOD OF MANUFACTURING THE SAME

[75] Inventors: Hideaki Imaichi; Takeshi Matsumoto; Yuji Suzuki; Koichi Himura; Tadayoshi Haneda, all of Chigasaki, Japan

[73] Assignee: Tokai Electronics Co., Ltd., Chigasaki, Japan

[ * ] Notice: The portion of the term of this patent subsequent to Apr. 28, 2009 has been disclaimed.

[21] Appl. No.: 9,855

[22] Filed: Jan. 27, 1993

Related U.S. Application Data

[63] Continuation-in-part of Ser. No. 827,509, Feb. 28, 1992, abandoned, which is a continuation of Ser. No. 634,529, Dec. 27, 1990, Pat. No. 5,108,822.

[30] Foreign Application Priority Data

Aug. 6, 1990 [JP] Japan .................................. 2-206791
Sep. 27, 1990 [JP] Japan .................................. 2-255210

[51] Int. Cl.6 .................................................. B32B 3/00
[52] U.S. Cl. .................................... 428/209; 428/457; 428/461; 428/515; 428/901; 216/6; 216/47; 216/13; 216/52
[58] Field of Search ............... 428/209, 457, 461, 515, 428/901; 340/572; 156/631, 634, 645, 656, 659.1, 661.1, 902

[56] References Cited

U.S. PATENT DOCUMENTS

| | | | |
|---|---|---|---|
| 1,621,058 | 3/1927 | Burger | 361/313 |
| 2,849,298 | 8/1958 | Werberig | 156/634 |
| 3,211,973 | 10/1965 | Ferrante | 361/303 |
| 3,227,934 | 1/1966 | Schill | 361/313 |

(List continued on next page.)

OTHER PUBLICATIONS

A. R. Blythe, "Electrical Properties of Polymers" 144–146 (1979).

(List continued on next page.)

FOREIGN PATENT DOCUMENTS

| | | |
|---|---|---|
| 980445 | 12/1975 | Canada . |
| 2507918 | 9/1976 | Germany . |
| 82/00541 | 2/1982 | WIPO . |

*Primary Examiner*—Patrick J. Ryan
*Assistant Examiner*—Elizabeth Evans
*Attorney, Agent, or Firm*—Finnegan, Henderson, Farabow, Garrett and Dunner

[57] ABSTRACT

A resonant tag is manufactured in the manner described below: a conductive thin film is formed to a predetermined thickness on two surfaces of an insulating thin film. Thereafter, a conductive pattern, composed of an inductor element and a capacitor element corresponding to a resonant frequency of a resonant circuit, is printed on a surface of one of the conductive thin films, and a conductive pattern, composed of a capacitor element corresponding to the resonant frequency of the resonant circuit, is printed on a surface of the other insulating thin film at a position which faces the capacitor element formed on one of the conductive thin films using an ink which resists etching. A non-printed portion of the conductive thin films is removed by etching to form a resonant circuit pattern. Thereafter, a portion of the insulating thin film, which corresponds to the capacitor element pattern, is thinned to a desired thickness by pressing a heating/pressing member heated to a predetermined temperature against that portion under a predetermined pressure for a predetermined period of time.

12 Claims, 8 Drawing Sheets

U.S. PATENT DOCUMENTS

| | | | |
|---|---|---|---|
| 3,231,479 | 1/1966 | Gordon et al. | 205/175 |
| 3,241,014 | 3/1966 | Rubinstein | 361/306.1 |
| 3,257,592 | 6/1966 | Maissel | 361/304 |
| 3,260,904 | 7/1966 | Booe | 361/313 |
| 3,316,467 | 4/1967 | Sperry | 361/275.1 |
| 3,473,096 | 10/1969 | Johnson et al. | 361/280 |
| 3,476,979 | 11/1969 | Stumpe et al. | 361/91 |
| 3,500,373 | 3/1970 | Minasy | 340/572 |
| 3,513,368 | 5/1970 | Boyer et al. | 361/280 |
| 3,521,280 | 7/1970 | Janco et al. | 342/44 |
| 3,562,496 | 2/1971 | Fisher | 235/439 |
| 3,609,741 | 9/1971 | Miller | 340/572 |
| 3,619,725 | 11/1971 | Sodem et al. | 257/529 |
| 3,624,631 | 11/1971 | Chomet et al. | 340/572 |
| 3,631,442 | 12/1971 | Fearon | 340/572 |
| 3,676,742 | 7/1972 | Russell et al. | 361/56 |
| 3,676,754 | 7/1972 | Maserjian et al. | 361/311 |
| 3,678,437 | 7/1972 | Vaden | 439/43 |
| 3,711,848 | 1/1973 | Martens | 340/572 |
| 3,740,742 | 6/1973 | Thompson et al. | 340/572 |
| 3,774,205 | 11/1973 | Smith et al. | 342/44 |
| 3,780,368 | 12/1973 | Northeved et al. | 340/572 |
| 3,787,717 | 1/1974 | Fischer et al. | 257/360 |
| 3,810,147 | 5/1974 | Lichtblau | 340/572 |
| 3,859,652 | 1/1975 | Hall et al. | 340/572 |
| 3,863,244 | 1/1975 | Lichtblau | 340/572 |
| 3,887,848 | 6/1975 | Larson et al. | 361/56 |
| 3,913,219 | 10/1975 | Lichtblau | 29/25.42 |
| 3,938,044 | 2/1976 | Lichtblau | 340/572 |
| 3,967,161 | 6/1976 | Lichtblau | 340/572 |
| 4,063,229 | 12/1977 | Welsch et al. | 340/572 |
| 4,072,976 | 2/1978 | Harari | 257/356 |
| 4,112,474 | 9/1978 | Wilson et al. | 361/15 |
| 4,134,146 | 1/1979 | Stetson | 361/130 |
| 4,150,419 | 4/1979 | Epple et al. | 361/275 |
| 4,318,090 | 3/1982 | Narlow et al. | 340/572 |
| 4,369,557 | 1/1983 | Vandebult | 29/25.42 |
| 4,410,831 | 10/1983 | Shigemori et al. | 313/325 |
| 4,498,076 | 2/1985 | Lichtblau | 340/572 |
| 4,567,473 | 1/1986 | Lichtblau | 340/572 |
| 4,876,555 | 10/1989 | Jorgensen | 343/895 |
| 5,108,822 | 4/1992 | Imaichi | 428/209 |
| 5,119,070 | 6/1992 | Matsumoto | 340/572 |
| 5,142,270 | 8/1992 | Appalucci | 340/572 |
| 5,182,544 | 1/1993 | Aquilera | 340/572 |
| 5,187,466 | 2/1993 | Pichl | 340/572 |
| 5,201,988 | 4/1993 | Matsumoto | 156/634 |
| 5,241,299 | 8/1993 | Appalucci | 340/572 |
| 5,291,180 | 3/1994 | Reeb | 340/572 |

OTHER PUBLICATIONS

W. G. Lawson, "Effects of Temperature and Techniques of Measurement on the Intrinsic Electric Strength of Polythene," 113 Proc. IEE 197 (1966) The Radio Amateur's Handbook, 53rd Edition, 1976.

Pratt, "A New Form of Needle Test for Polyethylene Insulation" IEEE Transactions On, vol. PAS-87, No. 7, Jul., 1968, pp. 1609–1613.

McMahon, et al., "Evaluation of Polyolefin High-Voltage Insulating Compounds; Dendrite (Tree) Formation Under Highly Divergent Fields," IEEE Transactions On, vol. 83, No. 12, Dec., 1964, pp. 1253–1261.

Kitchin et al., "Treeing in Polyethylene as a Prelude to Breakdown," Transactions of the American Institute of Electrical Engineers, vol. 77, 1958, pp. 180–186.

RESONANT TAG AND METHOD OF MANUFACTURING THE SAME

This application is a Continuation-In-Part of U.S. patent application Ser. No. 07/827,509, filed Feb. 28, 1992, now abandoned, which is a Continuation under 37 CFR 1.60 of U.S. Ser. No. 07/634,529 filed Dec. 27, 1990, now U.S. Pat. No. 5, 108,822.

BACKGROUND OF THE INVENTION

The present invention relates to a resonant tag and a method of manufacturing a resonant tag. Particularly, the present invention is concerned with a resonant tag to be adhered to an item on sale for the confirmation of a robbery such as a shoplifting, and a method of manufacturing such a resonant tag.

Conventional resonant tags used for the purpose of preventing robbery such as shoplifting in supermarkets, speciality stores or department stores contain a resonant frequency circuit which is manufactured in the manner described below. Aluminum foils having different thicknesses are bonded by various bonding methods to the two surfaces of a synthetic resin film, such as a polyethylene, having a predetermined thickness and serving as a dielectric. Subsequently, a RL circuit pattern and a capacitor first circuit pattern are printed on the surface of the aluminum foil having a larger thickness by, for example, gravure printing, and a capacitor second circuit pattern is printed on the surface of the aluminum foil having a smaller thickness by the same printing method. Thereafter, etching is conducted on the aluminum foils using an alkali (caustic soda) or acid (ferric chloride) chemical.

It is possible to manufacture RLC resonant frequency by electrically connecting the circuit patterns on both sides of the synthetic resin film.

In the resonant tag manufactured in the manner described above, the synthetic resin film, such as polyethylene, used as the dielectric, is formed by melting a resin and then by forming the molten resin by the extrusion.

Hence, the thickness of the synthetic resin film such as polyethylene, which is used as the dielectric in the resonant tag, is not uniform in both the direction of extrusion and the direction transverse to it, non-uniformity depending on the precision of the extruder and the skill of the manufacturing technique. That is, the thickness of the synthetic resin film varies within a certain percentage range of the designed thickness.

When resonant tags are manufactured, a large number of resonant tags are arranged in rows and columns on a material which is as wide as possible to achieve reduction in the production cost. This makes the thickness of the dielectrics of all the tags arranged in rows and columns varied.

Variations in the resonant frequency of the resonant tag is largely affected by variations in the thickness of the dielectric of a capacitor circuit.

In consequence, variations in the thickness of the dielectrics of the respective resonant tags cause variations in the resonant frequencies of the respective resonant tags.

This may generate large amount of partially defective resonant tags whose resonant frequency is varied greatly due to the variations in the thickness of the dielectric in both directions of the arrangement, although the amount finally depends on the performance of an electronic detector for detecting passage of a resonant tag. That is, resonant tags whose resonant frequency cannot be detected by the electronic detector are generated. This greatly reduces the productivity and raises the production cost.

In the case of the resonant tags in which the electrode plates of the capacitor circuit patterns are located at the center of the RL circuit pattern (the coil), passage of the magnetic flux therethrough is interferred by the capacitor circuit patterns. Therefore, capacitor circuit patterns having small area electrode plates are desired to improve the performance of the resonant tag. The area of the electrode plates is not a factor which determines the general performance of the resonant tag but a factor which, together with the thickness of the dielectric, affects the capacitance of the capacitor circuit and thereby the resonance frequency.

In case the area of the electrode plates for the capacitor are reduced to enhance the performance, the thickness of the dielectric which corresponds to the capacitor circuit must be reduced as well to obtain the same resonant frequency.

However, manufacture contains various types of machinings including etching, so the resonant tag must have a sufficient mechanical strength which resists these machinings. Hence, there is a limitation to the reduction in the thickness of the dielectric such as the synthetic resin film.

Furthermore, the accuracy of the extruder is in inverse proportion to the thickness of the dielectric.

At present, the lower limit of the thickness of the synthetic resin film which can be used for manufacturing tags under the above conditions is 25 microns ±4 microns in terms of the precision of the extruder and the strength of the material required for the machinings.

SUMMARY OF THE INVENTION

In view of the aforementioned problems of the related art, an object of the present invention is to provide a resonant tag in which the portion of a dielectric, which affects a resonant frequency of a resonant tag, is controlled to a uniform and desired thickness, and in which the area of the electrode plates of the capacitor circuit is small, as well as a method of manufacturing such a resonant tag.

To this end, the present invention provides a resonant tag which comprises an insulating thin film, a first capacitor circuit pattern and a RL circuit pattern which are formed on one surface of the insulating thin film, the RL circuit pattern being located outside of the capacitor first circuit pattern, and a capacitor second circuit pattern formed on the other surface of the insulating thin film at least at a position which faces the capacitor first circuit pattern. At least almost the portion of the insulating thin film on which the two capacitor circuit patterns are formed is thinned to a predetermined thickness thereby adjusting the resonant frequency. The individual conductive patterns form an RLC resonant circuit having an inherent resonant frequency.

The present invention further provides a method of manufacturing such a resonant tag which comprises the steps of forming a conductive thin film with a predetermined thickness each on two surfaces of an insulating thin film, printing, on a surface of one of the conductive thin films, a first conductive pattern composed of a RL circuit pattern and a capacitor first circuit pattern using an ink which resists etching, as well as a capacitor second circuit pattern on a surface of the other insulating thin film at a position which faces the capacitor first circuit pattern formed on the first conductive thin film using the ink which resists etching, removing a non-printed portion of the conductive thin films by etching, thinning at least almost a portion of the insulating thin film corresponding to the capacitor circuit patterns formed by the etching process to a desired thickness by pressing a heating/pressing member heated to a predetermined temperature against that portion under a predetermined pressure for a predetermined period of time, and forming a RLC resonant circuit by electrically connecting the circuit patterns on both sides of the insulating thin film.

In this way, the portion of the insulating thin film corresponding almost to the capacitor circuit patterns whose variations of the thickness vary the resonant frequency can be thinned to a desired thickness with a very high degree of accuracy. This enables provision of a resonant tag incorporating a resonant circuit having a desired resonant frequency.

Further objects, features and advantages of the present invention will become apparent from the following detailed description of embodiments of the present invention with reference to the accompanying drawings.

DETAILED DESCRIPTION OF THE PREFERRED EMBODIMENTS

First embodiment of the present invention will now be described with reference to FIGS. 1-10.

In this embodiment, a resonant tag has a resonant circuit which has a resonant frequency inherent to the circuit and which is formed on an insulating thin film. The resonant circuit contains one RL circuit pattern and one capacitor first circuit pattern formed integrally with the RL circuit pattern. The resonant circuit further contains a capacitor second circuit pattern. The resonant circuit is a RLC circuit which can be tuned to resonance at a given frequency.

Figure 1:
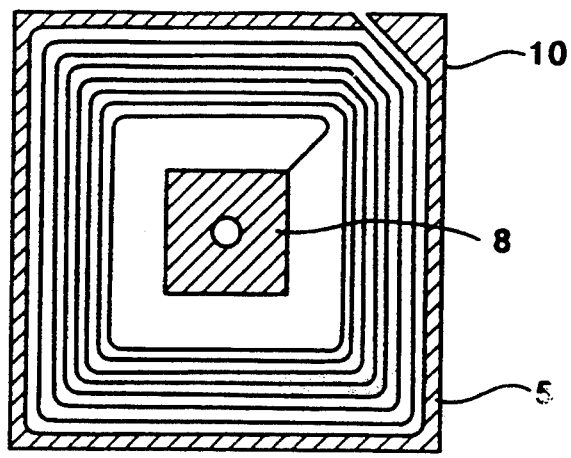
FIG. 1 shows a RL circuit pattern of a resonant tag according to the present invention.
Figure 2:
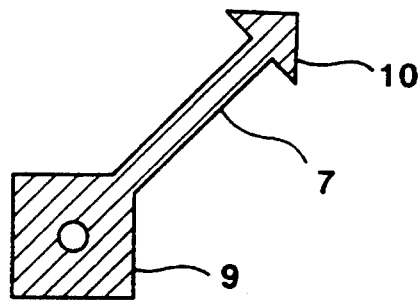
FIG. 2 shows a capacitor circuit pattern of the resonant tag of FIG. 1.

FIG. 1 shows an example of a conductive metal foil pattern formed on the RL circuit pattern and capacitor first circuit pattern forming surface, and FIG. 2 shows an example of a conductive metal foil pattern formed on the capacitor second circuit pattern forming surface.

In FIGS. 1 and 2, a reference numeral 1 denotes an insulting synthetic resin film which constitutes a dielectric; 5, a RL circuit pattern of the resonant circuit which is formed on the insulating synthetic resin film 1; 8 and 9, electrode plates which constitute capacitor circuit patterns of the resonant circuit which are formed on the insulating synthetic resin film 1; 7, a connecting portion and 10, terminal portions for electrically connecting the circuit patterns on both sides of the synthetic resin film. The RL circuit pattern 5, the capacitor circuit patterns 8 and 9 and the terminal portions 10 are formed of a conductive metal foil.

Figure 3:
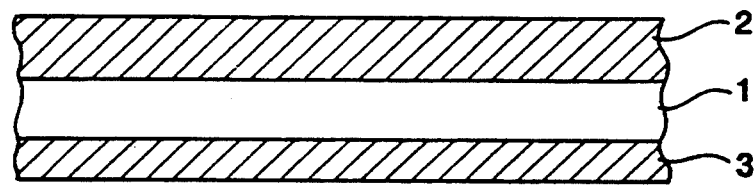
FIG. 3 shows a flexible sheet to which conductive metal foils are fixed.

As shown in FIG. 3, a printed circuit board material on which a resonant circuit is formed is a composite material composed of an insulating synthetic resin film 1 and conductive metal foils 2 and 3, having different thicknesses, formed on the two surfaces of the synthetic resin film 1 by, for example, extrusion or heat lamination.

The RL circuit pattern 5 and the capacitor first circuit pattern 8, shown in FIG. 1, are formed on one surface of the insulating synthetic resin film 1, and the capacitor second circuit pattern 9, shown in FIG. 2, is formed on the other surface of the insulating synthetic resin film 1. The patterns 5, 8 and 9 in combination form a resonant circuit. The terminal portion 10 of the capacitor second circuit pattern 9 is formed on one surface of the insulating synthetic resin film 1 at a position where it faces the terminal portion 10 of the RL circuit pattern 5 formed on the other surface of the insulating synthetic resin film 1, so that the terminal portions 10 of the two patterns 5 and 9 can be electrically connected to form the resonant circuit.

The circuit patterns may be printed by various printing methods, including silk screen printing, flexographic printing, letterpress printing and gravure printing.

The insulating synthetic resin film 1 may be formed of a synthetic resin which has a relatively low dielectric dissipation factor at a frequency, which corresponds to the resonant frequency of the designed resonant circuit and which permits accurate tolerance in thickness, such as polyethylene, polypropylene, polystyrene or polyester.

The metal foil may be formed of various metals having a good conductivity, such as gold, silver, copper or aluminum, or various alloys of such metals.

From the viewpoint of production cost, a combination of polyethylene and aluminum foil is preferable because of its inexpensiveness. It is preferable, in terms of adhesion also because aluminum foil can be adhered to the polyethylene resin easily. Also, aluminum foil ensures excellent flexibility.

Thus, the present embodiment employs a polyethylene film as the insulating synthetic resin film 1 and an aluminum foil as the conductive metal foil.

Polyethylene employed in this embodiment to form the insulating synthetic resin film may have any density. However, polyethylene having an intermediate density is desired from the viewpoints of the performance of the tag and the mechanical strength thereof.

Manufacture process of the thus-arranged resonant tag will be described below with reference to FIG. 4.

When a resonant tag is manufactured, a flexible sheet shown in FIG. 3, composed of the insulating synthetic resin film 1 and the conductive metal foils 2 and 3 formed on the two surfaces of the film 1, is prepared first in step S1.

Various types of aluminum foils, such as those conforming to AA standard (standard enacted by the American Aluminum Association) 1050, 1100 and 1235, can be employed as the conductive metal foils.

The thickness of the metal foils such as aluminum foils is determined by the designed electric resistance, inductance, the etching accuracy and the production cost. However, in this embodiment, to achieve reduction in the electric resistance, a thick foil 2 is used to form the RL circuit pattern and so on. A thin foil 3 is used to form the capacitor second circuit pattern because a thin film reduces the etching cost.

In this embodiment, an aluminum foil having a thickness of 50 microns ($\mu$m) is used to form the RL circuit pattern and the capacitor first circuit pattern, and an aluminum foil having a thickness of 12 microns ($\mu$m) is used to form the capacitor second circuit pattern. Both aluminum foils conform to AA standard 1235. However, the thickness and the size are not limited to these values.

The thickness of the insulating synthetic resin film 1, such as polyethylene film, is determined by the design of the resonant tag (the size, frequency, performance and so on), the thickness control accuracy of a machine used to form the film, and the mechanical strength with which the film resists etching and subsequent machinings. To raise the factor Q of the resonance circuit, a thin insulating synthetic resin film is desired as the film on which the capacitor circuit patterns are formed and a small size of the capacitor circuit patterns is desired.

To set the capacitance of the capacitor circuit of the resonant circuit within a predetermined range, variations in the thickness of the insulating synthetic resin film 1 must be within a predetermined range. Allowable variations in the thickness of the film differ depending on the designed thickness. For example, ±3 microns is allowed for in the case of the film whose designed thickness is 25 microns ($\mu$m). In the case of 13 microns, an allowance is ±0.5 microns.

Thickness control of ±3 microns is possible, whereas thickness control of ±0.5 microns may only be partially possible. However, when productivity and production cost are taken into consideration, thickness control is not practical in terms of mass productivity.

However, the resonant frequency is affected almost only by the thickness of the portion of the insulating synthetic resin film on which the capacitor circuit patterns are formed, and variations in the thickness of the other portion do not have a great effect on the resonant frequency. Hence, in this embodiment, a synthetic resin film having a thickness of 26 microns with an allowance of ±5 microns is employed, and the portion thereof corresponding to the capacitor circuit patterns is heat pressed to a desired and highly accurate thickness in the manner described below after the circuit patterns are formed on the film. The thickness of the synthetic resin film is therefore not limited to 26 microns. Conventional strict control on the variations in the thickness is not required, either.

The subsequent heat pressing process allows the use of a synthetic resin film having a given thickness suited to the existing manufacturing facility.

The insulating synthetic resin film 1 is covered by the conductive metal foils 2 and 3 by either of the following two manners:

(1) The conductive metal foils 2 and 3 are directly adhered to the film 1 extruded from a T die of an extruder.

(2) The insulating synthetic resin film 1 with the conductive metal foils 2 and 3 on the two surfaces are passed between rolls which are heated to a predetermined temperature so as to adhere the film 1 to the metal foils 2 and 3 by means of the heat and the pressure applied by the rolls.

With the machinings conducted subsequent to the adhesion taken into consideration, the insulating synthetic resin film 1 should be adhered to the conductive metal foils at an adhesive strength of 300 g/cm or above.

The adhesive strength may be increased by activating the surface of both types of material or of either material. Corona discharge process may be employed for surface activation.

Furthermore, an adhesive layer may be provided between the two types of material. In that case, an adhesive formed of the same resin as the insulating synthetic resin 1 may be used.

Figure 5:
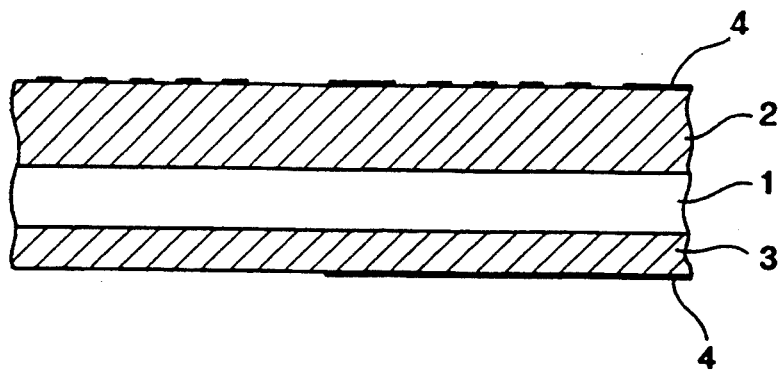
FIG. 5 is a cross-sectional view of a flexible sheet on which patterns are printed.

Next, in step S2, a resonant circuit pattern, consisting of the RL circuit pattern 5, the capacitor first circuit pattern 8 and the terminal portion 10 shown in FIG. 1 and the capacitor second circuit pattern 9, the connecting portion 7 and the terminal portion 10 shown in FIG. 2, is printed by the gravure printing method on the surfaces of the conductive metal foils 2 and 3 using an acid-proof or alkali-proof printing ink which resists etching (a polyester type ink which resists etching is employed in this embodiment). FIG. 5 shows the cross-section of a composite material on which this etching-resistant ink is printed. In FIG. 5, a reference numeral 4 denotes an etching resistant printing ink attached to the surfaces of the conductive metal foils.

Next, in step S3, etching process is conducted, and the portion of the metal foils 2 and 3 which does not form the printing patterns is thereby removed using a known etchant, composed of a basic chemical such as an acid (ferric chloride or the like) or alkaline (caustic soda or the like) solution and various admixtures added to the basic chemical.

Although the type of chemical liquid used in this etching process depends on the type of conductive metal foil to be removed, in the case of the aluminum foil employed in this embodiment, an aqueous solution of ferric chloride is used. During the etching, the temperature and the concentration of this etchant are controlled in accordance with the amount of metal foil to be dissolved, the designed circuit patterns, etching rate and so on.

In the case of the spraying method, the liquid pressure at the distal end of the nozzle is also adequately controlled.

Figure 6:
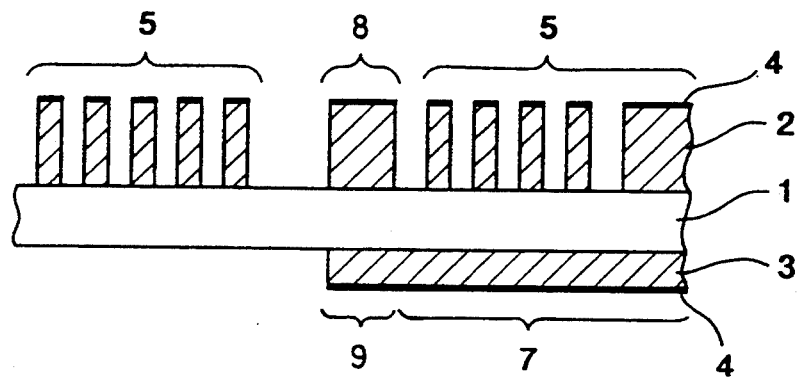
FIG. 6 is a cross-sectional view of a flexible sheet which has been subjected to etching.

FIG. 6 shows the cross-section of a composite material which has been subjected to the etching process. In FIG. 6, a reference numeral 5 denotes the RL circuit pattern shown in FIG. 1; 8, the capacitor first circuit pattern shown in FIG. 1; 7, the connecting portion shown in FIG. 2; and 9, the capacitor second circuit pattern shown in FIG. 2.

Subsequently, heat pressing is conducted in step S4.

Figure 7:
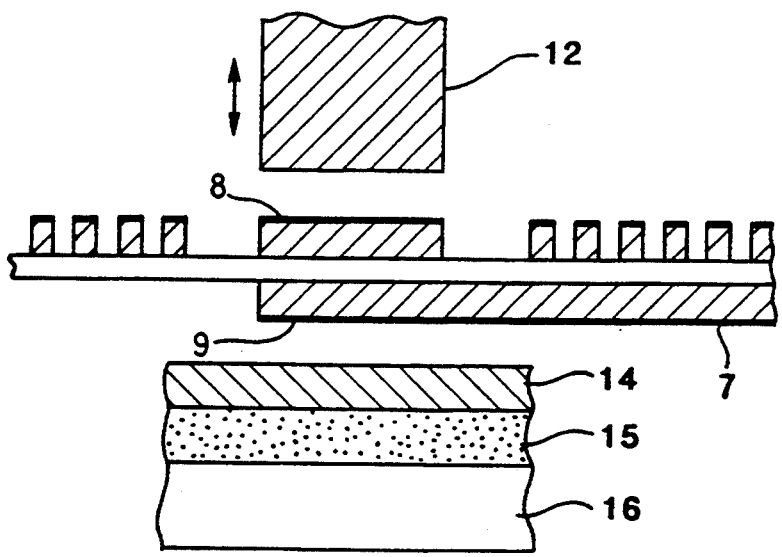
FIG. 7 shows a heat pressing jig employed in the present invention.

FIG. 7 shows the pressing jig used in this heat pressing process.

In FIG. 7, reference numeral 12 denotes a heating plate which is made of a metal such as stainless steel and in which a heating member (not shown) is disposed. The heating plate can be heated to a desired temperature, and be pressed under a desired pressure against a stainless steel plate 14 by an elevator (not shown). 15 denotes a heat-resistant rubber such as silicone rubber or Teflon and 16, a receptor.

The heat pressing process is conducted in the manner described below.

The heating plate 12 heated to a predetermined temperature is pressed under a predetermined pressure against the capacitor first circuit pattern 8 for a predetermined period of time, whereby the polyethylene film, i.e., the dielectric 11, between the capacitor first and second circuit pattern is heated through the capacitor first circuit pattern 8, and thereby melted and thinned. The thickness of the dielectric between the two capacitor circuit patterns can be adjusted with a high degree of accuracy by adjusting the pressure and the pressing time.

The temperature to which the heating plate 12 is heated, the pressure under which the heating plate 12 is pressed against the capacitor first circuit pattern 8, and the pressing time can be set to adequate values with the area of the capacitor first circuit pattern 8 and the thickness of the dielectric 11 between the two capacitor circuit patterns 8 and 9 taken into consideration.

At that time, a capacitance of the capacitor circuit which, beside the RL value of the RL circuit pattern, ensures a desired resonant frequency is determined by the thickness of the dielectric and the area of the capacitor circuit patterns. For example, assuming that the dimension of the single resonant tag is 40 mm×40 mm and that a desired resonant frequency is 8.2 MHz, the thickness of the dielectric 11 and the dimension of the capacitor circuit patterns must be set to values listed in Table 1.

TABLE 1

| Area of the capacitor circuit patterns (mm × mm) | Thickness of the dielectric (micron) |
| --- | --- |
| 13 × 14 | 26 |
| 10 × 10 | 14 |
| 7.5 × 7.5 | 8 |

The pressure and the pressing time may be controlled while the temperature of the heating member 12 is maintained constant. Alternatively, the heating temperature and the pressing time may be controlled while the pressure is maintained constant.

In the heat pressing process, the jig is controlled in the manner described below.

Tables 2 and 3 list the conditions under which the jig is controlled when the dimension of the capacitor circuit patterns is 10×10 mm while the thickness of the dielectric is reduced from 26 microns to 14 microns and when the dimension of the capacitor circuit pattern is 7.5 mm×7.5 mm and the thickness of the dielectric is reduced to 8 microns. The above-described thicknesses of the dielectric could be obtained under the same conditions in either case.

Table 2 shows combinations of the pressure under which the heating body 12 is pressed against the capacitor circuit pattern 8 and the pressing time when the heating temperature is maintained to 250° C.

TABLE 2

| Pressure (kg/cm²) | Time (second) |
| --- | --- |
| 3 | 4.5 |
| 4 | 3 |
| 5 | 2 |

Table 3 shows combinations of the heating temperatures of the heating body 12 and the pressing time when the pressure is maintained to 4 kg/cm².

TABLE 3

| Temperature (°C.) | Time (second) |
| --- | --- |
| 200 | 3.5 |
| 250 | 3 |
| 300 | 1.5 | by the heat pressing process, the thickness of the dielectric between the capacitor circuit pattern can be thinned uniformly to a desired value over the entire surface thereof.

Figure 8:
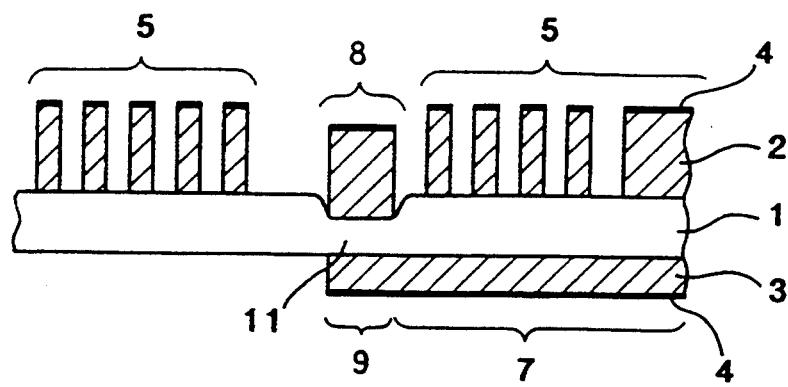
FIG. 8 is a cross-sectional view of a flexible sheet which has been subjected to heat pressing.

FIG. 8 shows a state in which the dielectric between the capacitor circuit patterns is thinned. In this embodiment, the portion of the dielectric which is thinned is substantially only the portion of the dielectric on which the capacitor circuit pattern 8 shown in FIG. 1 is formed. Hence, a sufficient strength of the entire resonant tag can be maintained throughout subsequent machinings and against the stress applied to the tag during the use by a user.

Thus, even when there are variations in the thickness of the insulating synthetic resin film 1 extruded from the extruder in step S1, the dielectric between the capacitor circuit patterns can be thinned with a high degree of accuracy substantially regardless of the variations.

Furthermore, control of the thickness of the dielectric is easy. For example, a dielectric film having a thickness of 26 microns can be readily thinned to 14 microns or below.

Furthermore, with a thickness restricting jig mounted on the end of the heat pressing jig, it is possible to control the thickness of the dielectric reliably and accurately regardless of the pressure and the pressing time.

Figure 9:
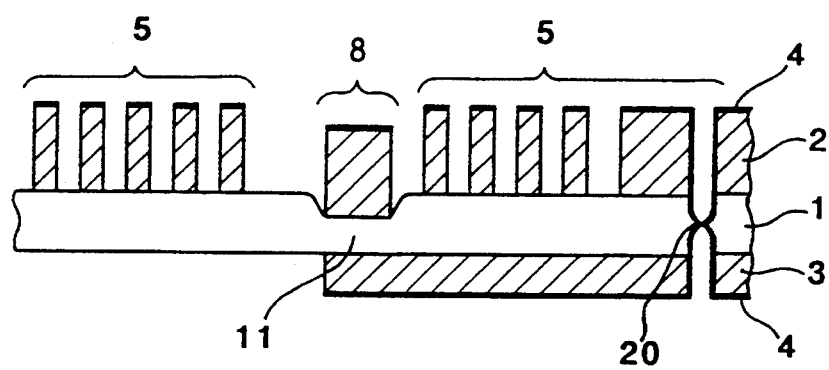
FIG. 9 is a cross-sectional view of a flexible sheet in whose connecting portions are electrically connected.

Subsequently, in step S5, the terminal portions 10 are electrically connected, thereby forming the resonant frequency circuit. In this way, the size of the resonant tag can be reduced. FIG. 9 shows this state. In FIG. 9, reference numeral 20 denotes the connected portion between the terminal portions 10.

Thereafter, in step S6, a sheet of good quality paper having, for example, a weight of 55 g/m² is adhered to the surface of the flexible sheet on which the RL circuit pattern is formed using an acrylic resin adhesive, and a sheet of parting paper having, for example, a weight of 60 g/m² is adhered to the other surface of the flexible sheet using a rubber type adhesive.

Figure 10:
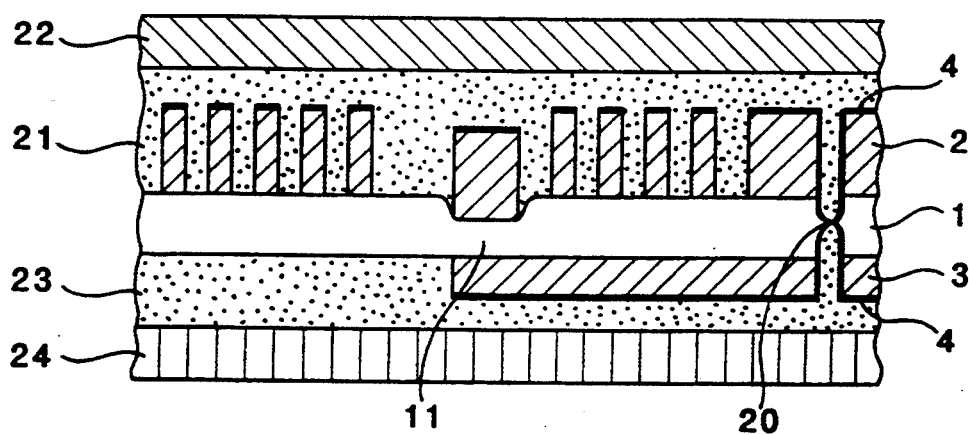
FIG. 10 shows a flexible sheet with a sheet of paper and a sheet of parting paper adhered thereto.

FIG. 10 shows the cross-section of a multi-layer flexible sheet on which the paper and the parting paper are adhered.

In FIG. 10, reference numeral 21 denotes an adhesive on the RL circuit pattern forming surface; 22, a sheet of good quality paper; 23, an adhesive on the capacitor second circuit pattern forming surface; and 24, a sheet of parting paper.

Thus, a final product that can be readily adhered to a desired commodity is obtained.

For the simplification of explanation, the above description centered on a single resonant tag. However, in a practical operation, the metal foil formation, the pattern printing, etching, the heat pressing and paper and parting paper adhesion are conducted using a roll of material having dimensions of 850 mm×1000 m. Hence, the unnecessary portion of the multi-layer sheet, with the paper and the parting paper adhered thereto, obtained in step S6 is removed except for the parting paper by a platen type die cutter. At that time, each product has dimensions of 40 mm×40 mm. Thereafter, sheet-like tags alined in a row are rolled up with the parting paper facing outward. The length of the roll is generally 100 m.

In this embodiment, the multi-layer sheet has the paper and the parting paper adhered thereto. However, any material can be used so long as it can retain the resonant circuit and can be peeled off when the resonant tag is used. An example of another possible material is a plastic sheet.

In this embodiment, it is possible to readily manufacture a resonant tag having a desired resonant frequency at a low cost regardless of variations in the thickness of the dielectric obtained in step S1. Such a resonant tag allows the frequency range of the resonant tag detector to be narrowed. As a result, a resonant tag system which is highly sensitive and which rarely malfunctions can be obtained.

Figure 11:
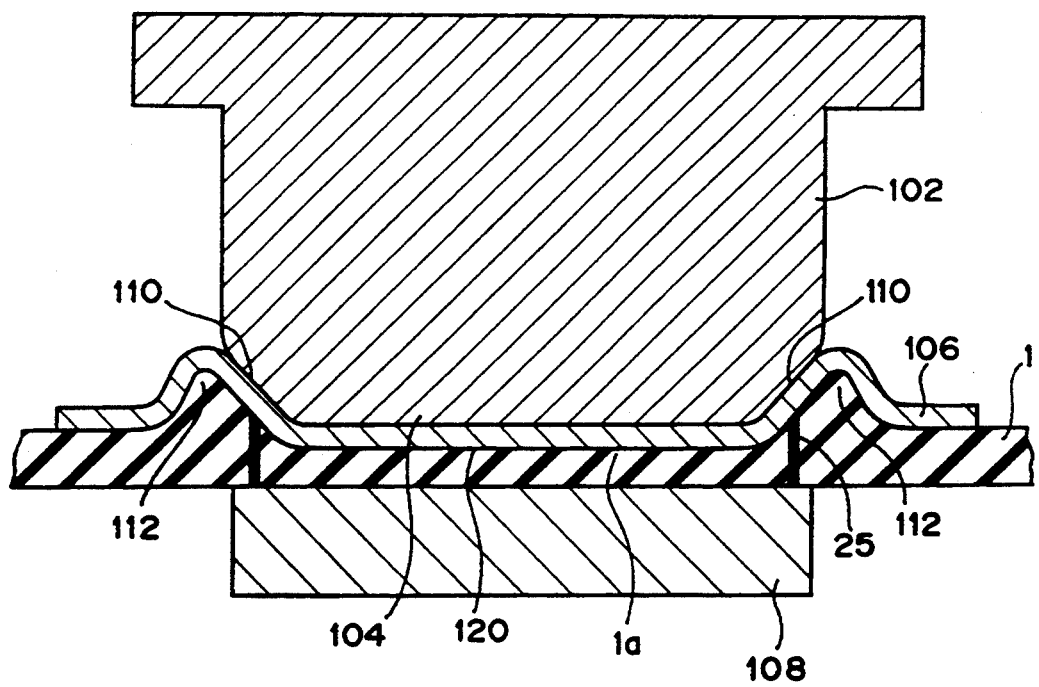
FIG. 11 shows in another embodiment the manner in which an insulating film is pressed.

If the heat pressing jig is brought into contact with the insulating material during the heat pressing process, the molten insulating material adheres to the head of the pressing jig and causes a stickiness on the head, hampering the thermal efficiency of heat pressing. To avoid such contact, the area of the capacitor circuit pattern can be made larger than the area of the head of the pressing jig like this is shown in FIG. 11. In FIG. 11, showing another embodiment of the present invention, a reference numeral 102 denotes a heat pressing jig; 106, a capacitor circuit pattern coming into contact with the heat pressing jig 102; and 108 the capacitor circuit pattern on the opposite side of the insulating synthetic resin material 1. In the embodiment as shown in FIG. 11, the area of the capacitor circuit pattern 106 is 14 mm×14 mm and the size of the capacitor circuit pattern 108 is 10×10 mm. Thus, the capacitor circuit pattern 108 fits within the capacitor circuit pattern 106 which opposes it, thereby sandwiching the insulating synthetic resin 1. Naturally, the electrostatic capacity of a capacitor is determined by the area over which its two electrodes overlap each other. The heat pressing jig 102 has at the center portion thereof a flat surface portion 104 the surface of which contacts the capacitor circuit pattern 106, leaving about 10% of the capacitor circuit pattern 106 on the outer periphery uncontacted. The end portion 110 around the flat surface portion 104 tapers off smoothly. Thus, when heat pressing is effected by means of the heat pressing jig 102, the insulating material 1 is forced out toward the taper surface 110 to form a protuberance 112 on the material 1. It should be noted that, since the heat pressing jig has the dimensions and the shape as described above, the connecting portion 7 is not pressed.

Further, in order to effectively use the thermal energy possessed by the jig, the thickness of the capacitor circuit pattern 106 is made relatively thinner than the thickness of the capacitor circuit pattern 108 on the opposite side of the insulating material 1. A certain thickness is, however, necessary for the capacitor electrode on the R,L circuit pattern side to reduce the electric resistance thereof. Different from the embodiment in FIG. 8, in the embodiment of FIG. 11, the R, L circuit pattern is arranged on the side of the capacitor circuit pattern 108.

The jig is heated to a certain temperature (temperature in Table 3); the heated jig is brought into contact with the larger-area capacitor circuit pattern 106 so that the jig covers at least the entire surface of the smaller-area capacitor circuit pattern 108 on the reverse surface of the insulating material; and the contacted electrode plate 106 is pressed toward the electrode 108 on the reverse surface at a certain pressure and for a certain time (Table 2). Thereby, it is possible to decrease the thickness of the dielectric 1a placed between the two capacitor circuit patterns.

The required time for obtaining the necessary thickness is determined by the thickness of the dielectric before working, the temperature of the jig and the pressure to be applied to the jig. The insulating material 1a at the portion pressed by the heated jig of the capacitor circuit pattern 106 is caused to concave, toward the side of the opposing capacitor circuit pattern 108. The dielectric 1a placed between the two capacitor circuit patterns 106 and 108 is thinned down to the required thickness for obtaining the resonant frequency by the heat and pressure of the jig based on the same principle as the thermoforming of a synthetic resin. The portion of the dielectric thinned down by such method is able to maintain a certain thickness even after the jig is removed. The dielectric resin which existed before working at the portion squeezed to be thinned down is absorbed by the resin on the periphery thereof along the shape of the jig 102 and, as a result, a harmony results as shown in FIG. 11 by exhibiting a protuberant shape which is thicker than the thickness before working by the heat pressing jig 102.

Controlling the thickness of the dielectric as described herebefore is of further advantage: The tags can be deactivated in an electromagnetic field with a voltage across the capacitor dielectric of only a few volts. The average thickness of the dielectric film produced by the protrusion method is 26 microns. The breakdown voltage of the capacitor using such a film is over 200 volts. This voltage is much to high to allow for deactivation of the tag by placing it in an electromagnetic field which complies with the Rules of the FCC. However, by reducing the thickness of the tag to such values and in such manner as described above, it is possible to deactivate tags with a significantly lower voltage such as 2 or 3 volts. That is, such a lower voltage can already cause a breakdown of the capacitor.

In order to provide tags with deactivation characteristics which can be used as commercial products, the thickness of the dielectric film should not be greater than about 15 microns. If the thickness is reduced to 8 microns, a perfect deactivation is guaranteed. Thus, by controlling the thickness of the dielectric by heating and pressuring, the breakdown voltage of the capacitor can be altered. In other words, by suitably changing the thickness of the dielectric, it becomes unnecessary to apply additional provisional treatment to the dielectric (as is required in the conventional product) to induce breakdown.

Figure 12:
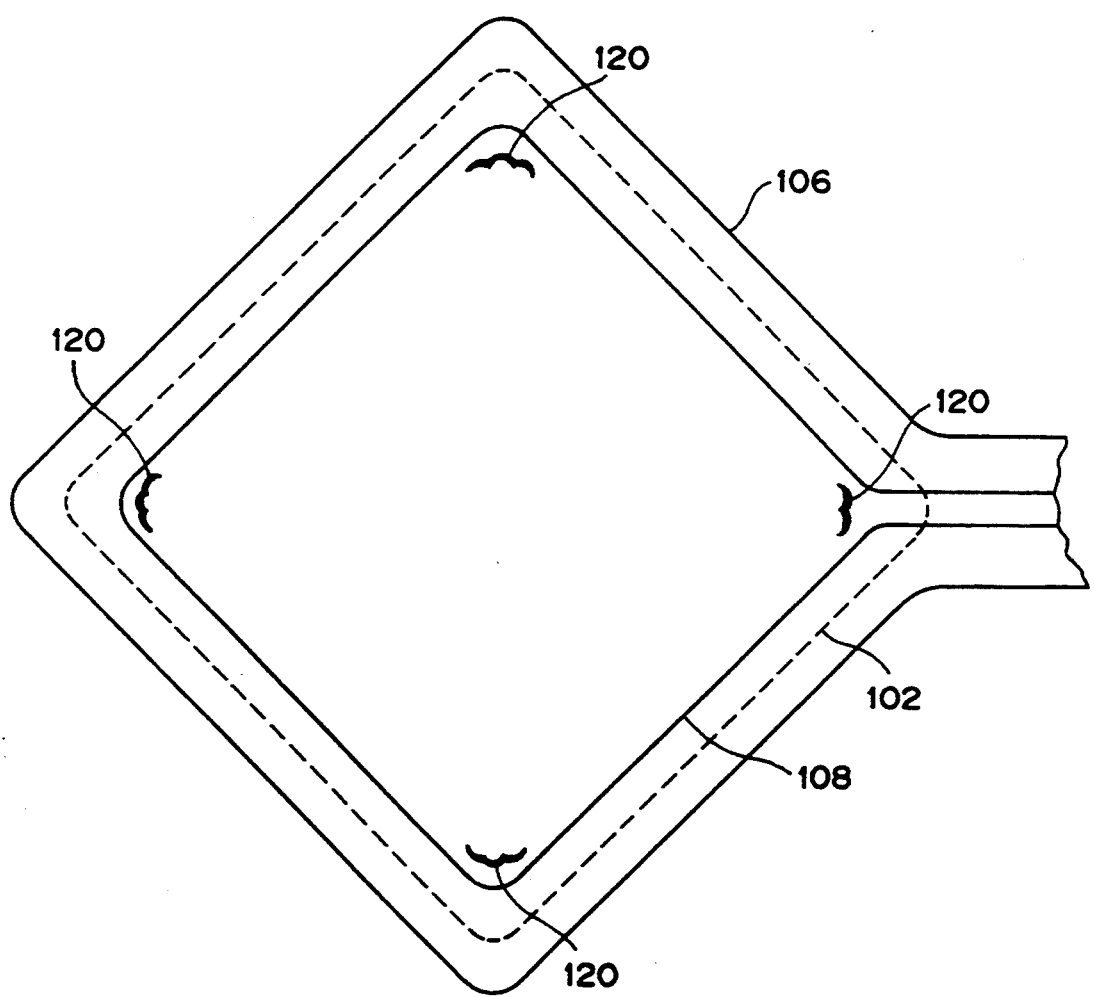
FIG. 12 shows the positional relationship of overlaid capacitor electrodes where the insulating film is removed.

Sandwiched between electrode plates, a synthetic resin film with a low melting point and low dielectric loss, such as a polyethylene film, has heat and pressure applied to it by a heating press on one or both sides of the electrode, as to reduce the thickness of the film to for example 8 microns. During this process, virtually all heat is applied directly to the polyethylene film because the film is covered with a very thin highly conductive aluminum foil. One reason why the resonant tag can be deactivated at a substantially lower voltage of only a few volts rather than several hundreds of volts may be that the applied heat may cause a change in the molecular structure of the polyethylene film, particularly in the direction of thickness, in which carbon molecules condense. This may reduce the dielectric property of the material, thus lowering the voltage necessary for breakdown. Accordingly, such a film is able to respond to a very low electromagnetic field. There may be, however, another or an additional reason for the low breakdown voltage which will be explained now with reference to FIG. 11 and FIG. 12. During the working using the heat pressing jig 102, some physical and chemical changes take place in the dielectric due to the applied heat and pressure with respect to the portion of the dielectric 1 around the jig which has been thickened (to about 40 micron) from the thickness before working (about 26 micron), thereby forming hole-like crevasses 120 having width of 50 microns to 100 microns, which as shown in FIG. 12 occur in a plurality of numbers and independently from each other at the respective corner portions of the jig. From an observation made on the crevasses 120 using an analytical instrument such as an electron microscope, it is confirmed that the crevasse passes generally vertically through the two electrodes and nothing (hollow) exists inside the crevasses. It is presumed that, when a certain voltage is applied to a capacitor having such crevasses, the resonant frequency characteristic thereof may be eliminated because dielectric breakdown occurs at the crevasses and the circuit thereat is short-circuited.

The deactivation rate of resonant tags according to the present invention is very high and thus reliability is also very high with respect to the commercial product. In prior art, a circuit which has once been short-circuited, in some cases, returns to its original state to exhibit the resonant frequency characteristic again as a result of pressure or shock that is continuously applied to the circuit with its resonance frequency characteristic being lost or that it is repeatedly bent several times. In the case of the resonance frequency circuit manufactured by the present method, however, the rate of occurrence of such phenomenon is very low based on the experiments using a quantity which is necessary and adequate for statistical processing, confirming its high reliability as a commercial product.

U.S. Pat. Nos. 4,567,473 and 4,498,076 are known as prior art which disclose a technique for eliminating a resonance frequency characteristic. They disclose a technique for applying an additional provisional treatment on a tag which has been produced as a resonant tag as was discussed before. In these arts, by a mechanical processing which is to be effected from one of the capacitor electrode plates of a flat-surface type circuit having a resonance frequency, the thickness of dielectric layer existing between the two electrode plates is thinned out locally at a point to a thickness at which dielectric breakdown may be easily caused when a certain voltage is applied across the two electrodes.

In the case of manufacturing using such method, though varying according to type of resin to be used as the dielectric, in order to cause a dielectric breakdown when a polyethylene resin is used, a thickness of 0.2 microns or less is theoretically required for the distance between the electrode plates, i.e., the thickness of the dielectric.

It is rather difficult in machining precision to maintain the thickness of the dielectric to be 0.2 microns or less, and the production efficiency during mass production is presumably rather low. If the thickness of the dielectric by machining is substantially thinner than 0.2 microns, for example 0.1 microns or less, there is a rather high probability that a breakdown easily occurs causing the dielectric to short circuit and the resonance frequency characteristic thereof to disappear due to static electricity generated, for example, by friction on the circuit surface or by an electronic device. This indicates a potential defect at the production stage prior to use as a commercial product in the market. If a sufficient inspection on products prior to shipment to the market is neglected, there is a risk that a defective product will be used in the market and confidence in the product is jeopardized.

U.S. Pat. No. 4,876,555 discloses a tag with a capacitor circuit the dielectric of which is provided with a throughhole. It is assumed that the deactivation takes place by means of an electric breakdown mechanism at the throughhole.

Figure 13:
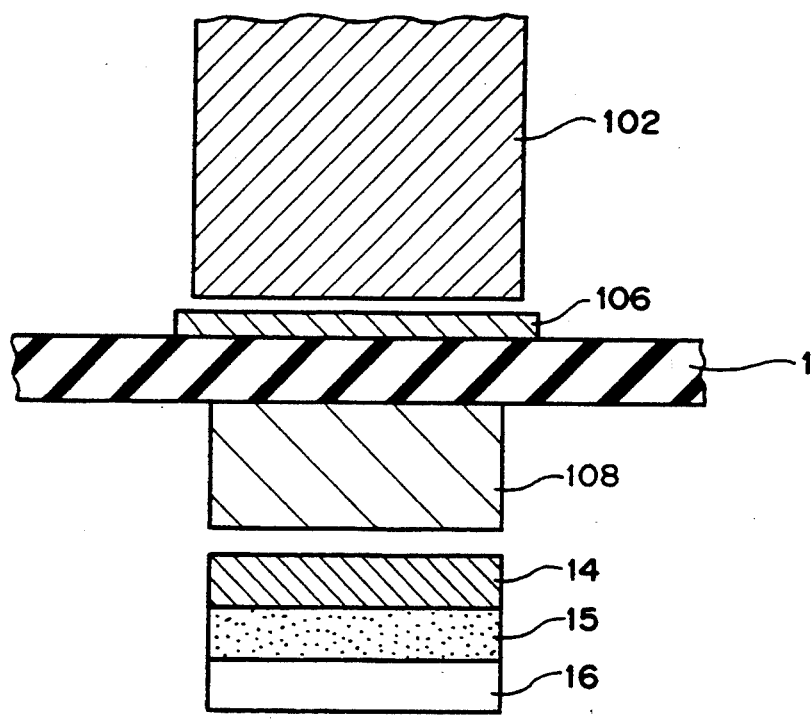
FIG. 13 shows a heat pressing jig employed in another embodiment.

FIG. 13 shows in further detail the construction of the processing tool as shown in FIG. 7. In the figure, steel having a thickness of about 0.2 mm to 1.0 mm and being preferably stainless steel is used as a plate 14 which directly contacts the electrode plate. By using a metal plate having such thickness, a suitable resiliency may be obtained. Reference numeral 15 denotes a heat resisting rubber containing a metal such as silicon, which is used at a thickness of about 1 mm to 5 mm and preferably has a high capability of being restored. While these two different materials are used one upon the other, in order to obtain the crevasse 120 in dielectric which presumably plays a significant role in dielectric breakdown, the combination of the suitable thickness respectively of the metal sheet and the heat resisting rubber is important. In the embodiments, the combination of steel having a thickness of 0.5 mm as the metal sheet and a heat resisting silicone rubber having a thickness of 2 mm was most suitable.

While the printing ink to be used in circuit printing is selected according to the type of etchant, when an acid solution such as ferric chloride is the etchant, the conductive pattern for forming the capacitor circuit pattern 106 is printed by an alkali-proof and acid-proof printing ink such as a polyester resin. Since a polyester resin is thermoplastic, the terminal end of the jig is soiled thus decreasing the thermal efficiency of the heat pressing jig instrument if the jig is repeatedly brought into contact with the resin. To prevent such soil, it is desirable to remove the printing ink on the conductive pattern 106. On the other hand, the ink on the conductive pattern for forming the capacitor circuit pattern 108 which does not contact the heat press instrument is preferably left as a protective coat to protect the aluminum surface from corrosion. For this reason, the conductive pattern 106 is printed by using a printing ink such as silicone resin which has an acid resistance but is soluble an alkaline solution. Since the printing inks used in circuit printing on both surfaces have acid resistance, these printing inks remain on the conductive thin film even after the circuit is formed by etching. However, by further using an alkaline solution such as caustic soda after the etching, the printing ink may be removed from the conductive thin film of the capacitor circuit pattern 106 which comes into contact with the pressing jig.

Figure 4:
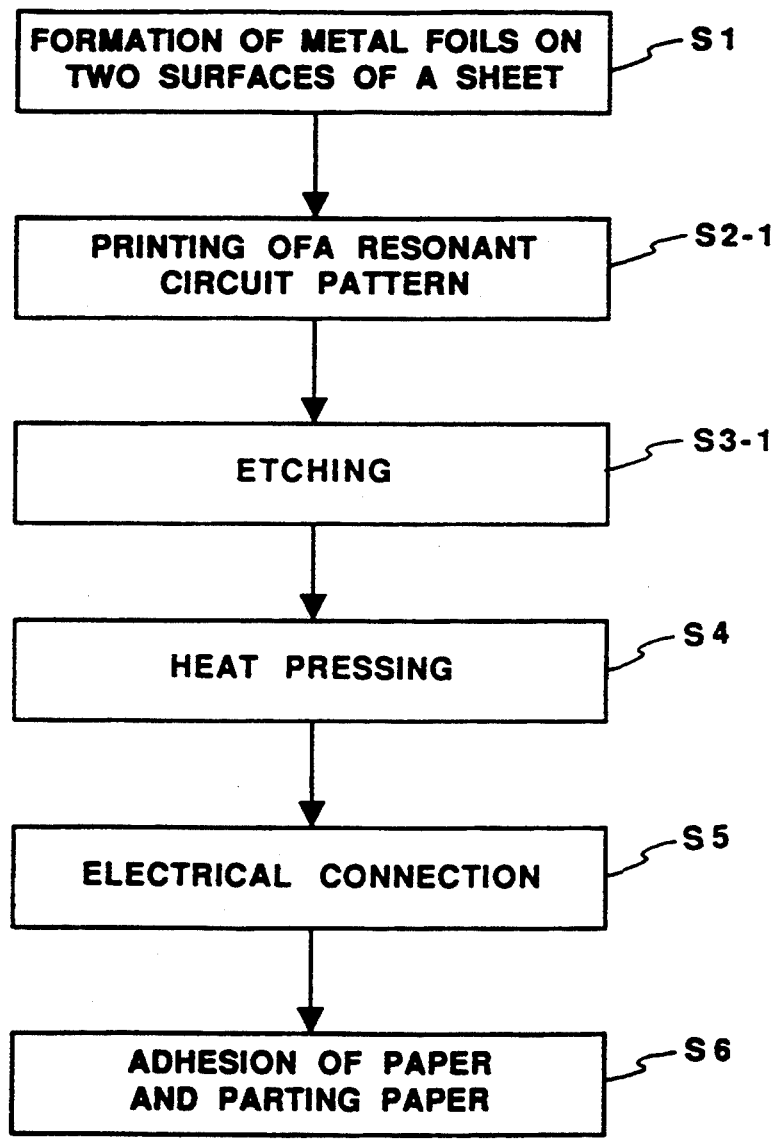
FIG. 4 is a flowchart of the manufacturing process of the resonant tag according to the present invention.
Figure 14:
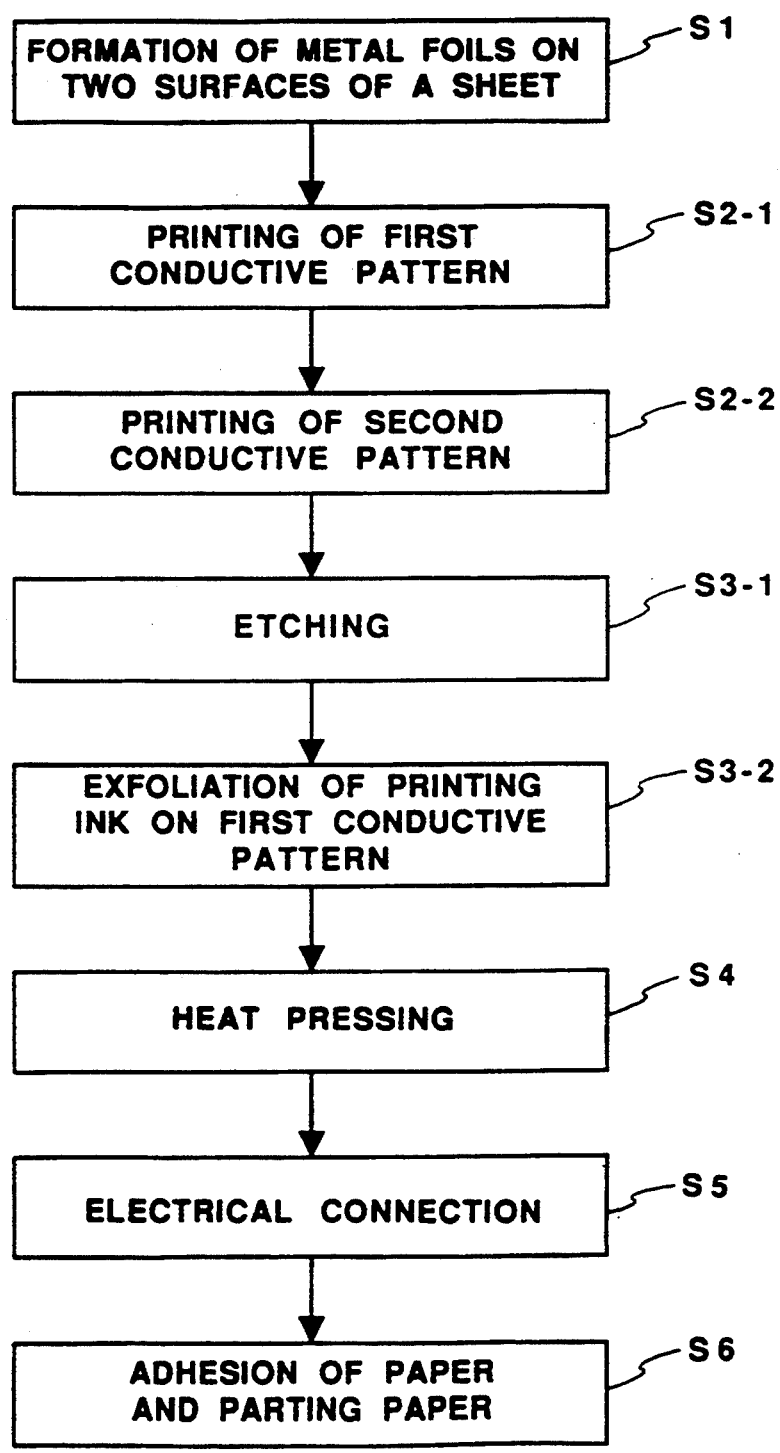
FIG. 14 is a flowchart of the manufacturing process of the resonant tag according to another embodiment of the present invention.

Accordingly, steps S2, S3 as shown in FIG. 4 are modified as shown in FIG. 14. First, at step S2-1, the conductive pattern 106 is printed by a printing ink which is soluble an alkaline solution. At step S2-2, the second conductive pattern 108 is printed by an ink which is both alkali-proof and acid-proof and, at step S3-1, etching is performed. Next, the resonance circuit pattern is dipped into an alkaline solution to effect the exfoliating step (S3-2) of the printing ink on the conductive pattern 106. By performing this step, the printing ink is removed from the capacitor circuit pattern 106 which contacts the heat press instrument while the printing ink remains as a corrosion preventing layer on the capacitor circuit pattern 108.

In this embodiment, only the portion of the dielectric corresponding to the capacitor circuit pattern 108 is thinned. However, thinning may also be conducted over a larger portion of the dielectric or over the entire resonant circuit to make the thickness thereof uniform. At that time, a thickness restricting jig may be used to limit the thickness to a desired one.

As will be understood from the foregoing description, it is possible according to the present invention to form a resonant circuit having a desired resonant frequency on a tag with a high degree of accuracy. Reliable detection of a tag is enabled by the detection of the resonant frequency of the resonant tag.

Further, when the present invention has been constructed as described, a resonant circuit which is highly accurate and has a desired resonant frequency may be formed on an insulating material whose surface is not flat. In addition, crevasses which are presumably useful in causing dielectric breakdown may be securely formed in the process where a flat surface circuit is deformed into a non-flat surface circuit having a tuning frequency. Since, in the process of deforming the flat surface circuit into the non-flat surface circuit having a tuning frequency, stickiness between the jig and the insulating material and the accompanying problem of temperature control may be solved by the larger electrode provided in the present invention, the yield in production is greatly improved.

The present invention is not limited to the above embodiments and various changes and modifications can be made within the spirit and scope of the present invention. Therefore, to apprise the public of the scope of the present invention the following claims are made.

What is claimed is:

1. A method of manufacturing a resonant tag, comprising the steps of:
    printing by using an etch-resistant material a first conductive pattern to form a conductive inductor element and a conductive capacitor element of a resonant circuit on one surface of conductive thin films having a predetermined thickness formed on the two surfaces of an insulating thin film;
    printing by using an etch-resistant material a second conductive pattern to form a capacitor element corresponding to the resonance frequency of the resonant circuit at a position opposing the disposed position of the capacitor element pattern on said one surface;
    etching, subsequent to the printing steps, for removing the non-printed portion of the conductive thin film;
    removing the ink on the remaining conductive pattern;
    thinning down to obtain a thin film of a desired thickness at least the portion generally corresponding to the disposed position of said capacitor element patterns of the resonant circuit pattern formed by said etching step; and
    forming an LC resonant circuit in the desired resonant circuit pattern portion by electrically connecting said first and second conductive patterns.

2. A method of manufacturing a resonant tag according to claim 1, wherein said etch-resistant material is a thermoplastic resin.

3. A method of manufacturing a resonant tag according to claim 1, wherein the step of removing the ink on said remaining conductive pattern is a step of removing the ink on said first conductive pattern remaining on the conductive pattern on the side of forming a thin film.

4. A method of manufacturing resonant tag according to claim 1, wherein the characteristics of the etch-resistant material for printing the first conductive pattern and the etch-resistant material for printing the second conductive pattern are different from each other.

5. A method of manufacturing a resonant tag, comprising the steps of:
    (a) printing a first conductive pattern on one surface of a first conductive film by using an etch-resistant material to form an inductor and a first electrode plate, the first conductive film being positioned on one surface of an insulating film;
    (b) printing a second conductive pattern on one surface of a second conductive film by using an etch-resistant material to form a second electrode plate, the second conductive film being positioned on the second surface of the insulating film, the second electrode plate opposing the first electrode plate;
    (c) etching the non-printed portions of the first and second conductive films such that the first and second electrode plates form a capacitor;
    (d) pressing a portion of one of the electrode plates into the insulating thin film, wherein the pressing increases the capacitance of the capacitor and creates at least one crevasse extending between the pressed portion and the unpressed electrode plate; and
    (e) electrically connecting the first and second conductive thin films to form a resonant circuit.

6. The method of claim 5, wherein the pressed portion opposes all of the first electrode plate.

7. The method of manufacturing a resonant tag according the claim 5, wherein the press comprises a metal in which a heating member is disposed.

8. A method of manufacturing a resonant tag according to claim 7, wherein the metal is stainless steel.

9. The method of manufacturing a resonant tag according to claim 7, wherein the press is smoothly tapered around the edges.

10. The method of manufacturing a resonant tag according to claim 5, wherein the press is smaller than the electrode plates.

11. The method of manufacturing a resonant tag according to claim 5, wherein a support plate opposes the press and comprises a stainless steel plate and a receptor separated by a heat resistant rubber.

12. A method of manufacturing a resonant tag according to claim 11, wherein the heat resistant rubber is silicone rubber or teflon.

* * * * *

UNITED STATES PATENT AND TRADEMARK OFFICE
CERTIFICATE OF CORRECTION

PATENT NO. : 5,447,779
DATED : September 5, 1995
INVENTOR(S) : IMAICHI ET AL.

It is certified that error appears in the above-indentified patent and that said Letters Patent is hereby corrected as shown below:

Column 4, line 9, change "insulting" to --insulating--.

Column 6, line 1, should not begin a new paragraph.

Column 8, line 20, change "by" to --By--.

Column 9, line 12, change "alined" to --aligned--.

Column 10, line 45, change "to" (first occurrence) to --too--.

IN THE CLAIMS:

Claim 1, column 13, line 56, after "element" (second occurrence) insert --corresponding to resonant frequency--;

UNITED STATES PATENT AND TRADEMARK OFFICE
CERTIFICATE OF CORRECTION

PATENT NO. : 5,447,779
DATED : September 5, 1995
INVENTOR(S) : IMAICHI ET AL.

It is certified that error appears in the above-indentified patent and that said Letters Patent is hereby corrected as shown below:

Column 13 line 57, after "circuit" insert --for forming the resonant circuit--.

Signed and Sealed this

Fifth Day of December, 1995

Attest:

BRUCE LEHMAN

Attesting Officer

Commissioner of Patents and Trademarks